United States Patent
Schubert et al.

(10) Patent No.: US 9,331,252 B2
(45) Date of Patent: May 3, 2016

(54) WAVELENGTH CONVERTERS, INCLUDING POLARIZATION-ENHANCED CARRIER CAPTURE CONVERTERS, FOR SOLID STATE LIGHTING DEVICES, AND ASSOCIATED SYSTEMS AND METHODS

(75) Inventors: Martin F. Schubert, Boise, ID (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 13/216,062

(22) Filed: Aug. 23, 2011

(65) Prior Publication Data

US 2013/0049569 A1 Feb. 28, 2013

(51) Int. Cl.
*H01L 33/08* (2010.01)
*H01L 33/50* (2010.01)

(52) U.S. Cl.
CPC .............. *H01L 33/502* (2013.01); *H01L 33/08* (2013.01)

(58) Field of Classification Search
USPC ............................................ 257/80, E33.061
See application file for complete search history.

(56) References Cited

U.S. PATENT DOCUMENTS

| | | | |
|---|---|---|---|
| 6,054,716 A | 4/2000 | Sonobe et al. | |
| 6,303,404 B1 * | 10/2001 | Moon et al. | 438/46 |
| 6,555,403 B1 * | 4/2003 | Domen et al. | 438/22 |
| 6,734,467 B2 * | 5/2004 | Schlereth et al. | 257/89 |
| 7,514,721 B2 * | 4/2009 | Krames et al. | 257/98 |
| 7,535,028 B2 | 5/2009 | Fan et al. | |
| 7,884,377 B2 | 2/2011 | Onushkin et al. | |

(Continued)

FOREIGN PATENT DOCUMENTS

| | | |
|---|---|---|
| JP | 2005056973 A | 3/2005 |
| WO | 2010093190 A2 | 8/2010 |
| WO | 2010126601 A1 | 11/2010 |

OTHER PUBLICATIONS

Colin Wood and Debdeep Jena, Polarization Effects in Semiconductors, 2008, Springer Science+Business Media, pp. 467-507, ISBN 978-0-387-36831-3.*

(Continued)

*Primary Examiner* — Anthony Ho
*Assistant Examiner* — Samuel Lair
(74) *Attorney, Agent, or Firm* — Perkins Coie LLP

(57) ABSTRACT

Wavelength converters, including polarization-enhanced carrier capture converters, for solid state lighting devices, and associated systems and methods are disclosed. A solid state radiative semiconductor structure in accordance with a particular embodiment includes a first region having a first value of a material characteristic and being positioned to receive radiation at a first wavelength. The structure can further include a second region positioned adjacent to the first region to emit radiation at a second wavelength different than the first wavelength. The second region has a second value of the material characteristic that is different than the first value, with the first and second values of the characteristic forming a potential gradient to drive electrons, holes, or both electrons and holes in the radiative structure from the first region to the second region. In a further particular embodiment, the material characteristic includes material polarization. Accordingly, the first region has a first material polarization value and the second region has a second material polarization value different than the first material polarization value, with the differences between the first and second material polarization values forming an electric field at an interface between the first and second regions.

25 Claims, 8 Drawing Sheets

(56) References Cited

U.S. PATENT DOCUMENTS

| | | | |
|---|---|---|---|
| 2002/0139984 A1* | 10/2002 | Sugawara | H01L 33/08 257/79 |
| 2007/0045609 A1 | 3/2007 | Saxler | |
| 2007/0284592 A1 | 12/2007 | Haase | |
| 2008/0093614 A1* | 4/2008 | Nagai | 257/98 |
| 2008/0150440 A1 | 6/2008 | Hsu | |
| 2008/0283822 A1 | 11/2008 | Yui | |
| 2009/0261372 A1* | 10/2009 | Ueda | 257/98 |
| 2009/0262527 A1 | 10/2009 | Chou | |
| 2010/0090232 A1 | 4/2010 | Huang et al. | |
| 2011/0031522 A1* | 2/2011 | Oya et al. | 257/98 |
| 2011/0101403 A1 | 5/2011 | Haase et al. | |
| 2011/0121319 A1 | 5/2011 | Haase et al. | |
| 2011/0186887 A1* | 8/2011 | Trottier et al. | 257/98 |

OTHER PUBLICATIONS

Morkoç et al., Polarization effects in nitride semiconductor device structures and performance of modulation doped field effect transistors, 1999, Elsevier Science, Solid-State Electronics 43, pp. 1753-1771.*

Colin Wood and Debdeep Jena, Polarization Effects in Semiconductors, 2008, Springer Science+Business Media, pp. 71, 72, and 467-507, ISBN 978-0-387-36831-3.*

International Search Report and Written Opinion issued Jan. 31, 2013 in International Application No. PCT/US2012/050161, 10 pages.

Franssen, G. et al., "Fully-screened polarization-induced electric fields in blue/violet InGaN/GaN light-emitting devices grown on bulk GaN," Applied Physics Letters 87, 041109, 2005, DOI: 10.1063/1.2000331.

Lee, W. et al., "Growth and characteristics of GaInN/GaInN multiple quantum well light-emitting diodes," Journal of Applied Physics 107, 063102, 2010, DOI: 10.1063/1.3327425.

Office Action issued May 21, 2014 in Taiwan Application No. 101130523, 23 pages.

* cited by examiner

US 9,331,252 B2

WAVELENGTH CONVERTERS, INCLUDING POLARIZATION-ENHANCED CARRIER CAPTURE CONVERTERS, FOR SOLID STATE LIGHTING DEVICES, AND ASSOCIATED SYSTEMS AND METHODS

TECHNICAL FIELD

The present technology is directed generally to wavelength converters, including polarization-enhanced carrier capture converters, for solid state lighting devices, and associated systems and methods. Wavelength converters in accordance with the present technology are suitable for LEDs and other radiation emitting devices.

BACKGROUND

Solid state lighting ("SSL") devices are used in a wide variety of products and applications. For example, mobile phones, personal digital assistants ("PDAs"), digital cameras, MP3 players, and other portable electronic devices utilize SSL devices (e.g., LEDs) for backlighting and other purposes. SSL devices are also used for signage, indoor lighting, outdoor lighting, and other types of general illumination. FIG. 1A is a cross-sectional view of a conventional SSL device 10a with lateral contacts. As shown in FIG. 1A, the SSL device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The SSL device 10a also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11. In operation, electrical power is provided to the SSL device 10a via the contacts 17, 19, causing the active region 14 to emit light.

FIG. 1B is a cross-sectional view of another conventional LED device 10b in which the first and second contacts 17 and 19 are opposite each other, e.g., in a vertical rather than lateral configuration. During formation of the LED device 10b, a growth substrate, similar to the substrate 20 shown in FIG. 1A, initially carries an N-type GaN 15, an active region 14 and a P-type GaN 16. The first contact 17 is disposed on the P-type GaN 16, and a carrier 21 is attached to the first contact 17. The substrate 20 is removed, allowing the second contact 19 to be disposed on the N-type GaN 15. The structure is then inverted to produce the orientation shown in FIG. 1B. In the LED device 10b, the first contact 17 typically includes a reflective and conductive material (e.g., silver or aluminum) to direct light toward the N-type GaN 15.

One drawback with existing LEDs is that they do not emit white light. Instead, LEDs typically emit light within only a narrow wavelength range. For human eyes to perceive the color white, a broad range of wavelengths is needed. Accordingly, one conventional technique for emulating white light with LEDs is to deposit a converter material (e.g., a phosphor) on an LED die. FIG. 1C shows a conventional SSL device 10c that includes a support 2 carrying an LED die 4 and a converter material 6. In operation, an electrical voltage is applied to the die 4 via contacts having an arrangement generally similar to that shown in either FIG. 1A or FIG. 1B. In response to the applied voltage, the active region of the LED die 4 produces a first emission (e.g., a blue light) that stimulates the converter material 6 to emit a second emission (e.g., a yellow light). The combination of the first and second emissions appears white to human eyes if matched appropriately. As discussed in more detail below, using phosphor converter materials to "convert" blue light into white light has certain drawbacks. Accordingly, there is a need for light emitting devices that can produce light at a particular wavelength without phosphor converter materials.

BRIEF DESCRIPTION OF THE DRAWINGS

Many aspects of the present disclosure can be better understood with reference to the following drawings. The components in the drawings are not necessarily to scale. Instead, emphasis is placed on clearly illustrating the principles of the present disclosure. Moreover, in the drawings, like reference numerals designate corresponding parts throughout the several views.

DETAILED DESCRIPTION

Embodiments of the presently disclosed technology are directed generally to wavelength converters for solid state lighting ("SSL") devices, and associated systems and methods. As used hereinafter, the term "SSL device" generally refers to devices with light emitting diodes ("LEDs"), organic light emitting diodes ("OLEDs"), laser diodes ("LDs"), polymer light emitting diodes ("PLEDs"), and/or other suitable sources of illumination, other than electrical filaments, a plasma, or a gas. Briefly described, a radiation system in accordance with a particular embodiment of the disclosed technology includes a solid state radiative semiconductor structure that has a first region and a second region. The first region has a first value of a material characteristic, and the second region has a second value of the material characteristic that is different than the first value. The first region is positioned to receive radiation at a first wavelength, and the second region is positioned adjacent to the first region to emit radiation at a second wavelength different than the first wavelength. The first and second values of the characteristic form a potential gradient to drive electrons, holes, or both electrons and holes in the radiative structure from the first region to the second region. Accordingly, the second region can receive optically generated carriers from the first region and emit radiation at the second wavelength. In particular embodiments, the radiative semiconductor structure can be positioned proximate to an energy source that directs radiation at the first wavelength toward the first region of the semiconductor structure. In further particular embodiments, the energy source can include a solid state lighting device, for example, an LED.

Other systems, methods, features, and advantages of the presently disclosed technology will become apparent to one of ordinary skill in the art. Several details describing structures or processes that are well-known and often associated with such systems and methods, but that may unnecessarily obscure some significant aspects of the disclosure, are not set forth in the following description for purposes of clarity. Moreover, although the following disclosure sets forth several embodiments of different aspects of the technology disclosed herein, several other embodiments can include different configurations or different components than those described in this section. Accordingly, the disclosed technology may have other embodiments with additional elements, and/or without several of the elements described below with reference to FIGS. 2-7.

Figure 1A:
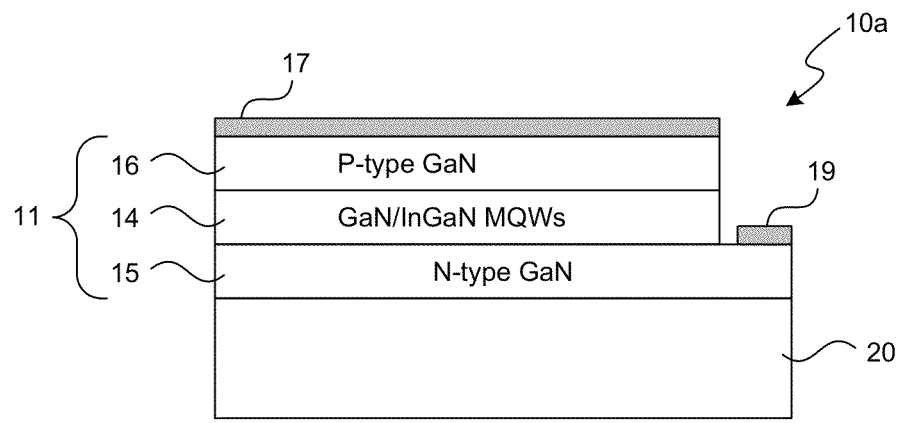
FIG. 1A is a partially schematic, cross-sectional diagram of an SSL device having a lateral arrangement in accordance with the prior art.
Figure 1B:
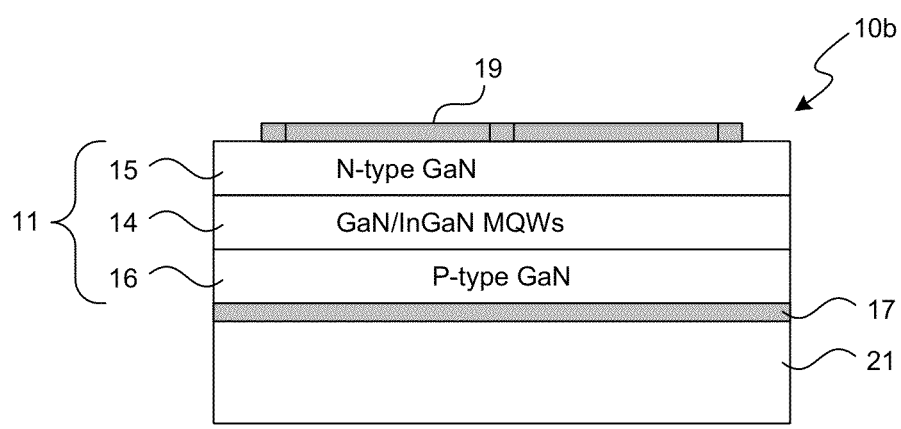
FIG. 1B is a partially schematic, cross-sectional diagram of another SSL device having a vertical arrangement in accordance with the prior art.
Figure 1C:
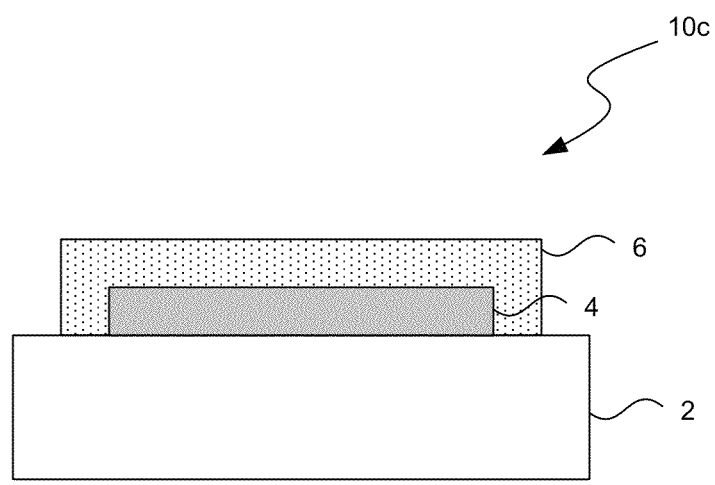
FIG. 1C is a partially schematic, cross-sectional diagram of a light emitting device having a phosphor converter material positioned in accordance with the prior art.
Figure 2:
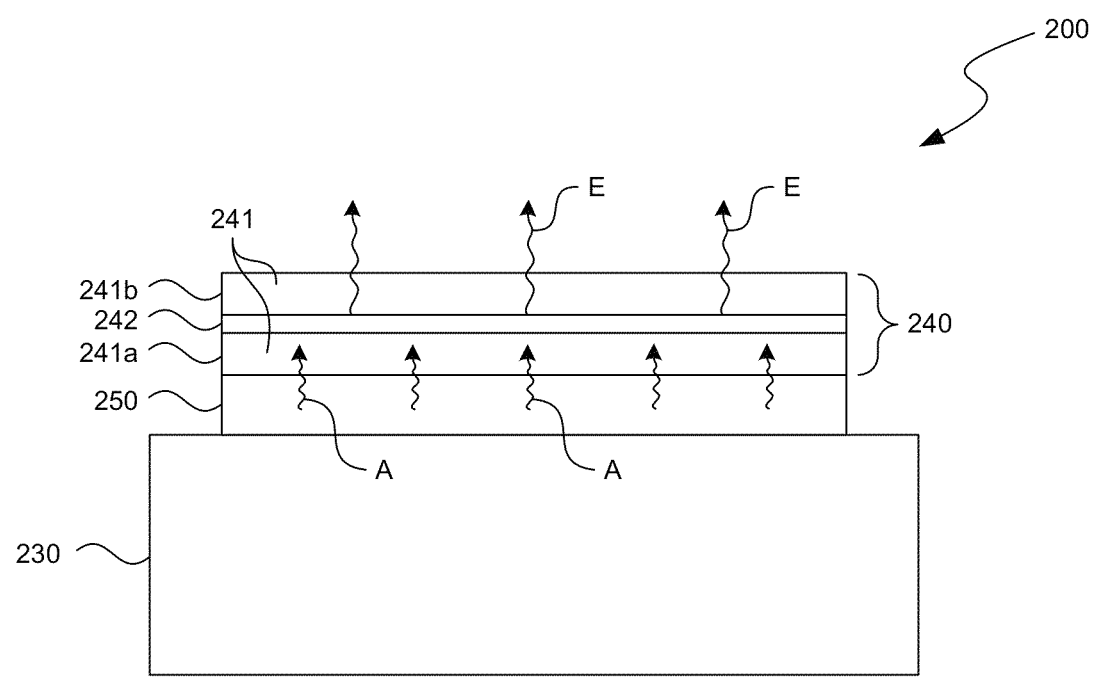
FIG. 2 is a partially schematic, cross-sectional illustration of a system that includes a light source and a radiative structure configured in accordance with an embodiment of the presently disclosed technology.

FIG. 2 is a partially schematic, cross-sectional illustration of a system 200 that receives or absorbs energy at one wavelength and re-radiates or emits energy at another wavelength. In a particular embodiment, the system 200 includes a support 230 carrying a light source 250. The light source 250 can include an LED or other SSL device, or another device (e.g., a laser) that emits first radiation at a first wavelength A. The system 200 further includes a radiative structure 240 positioned to receive and absorb the first radiation and emit second radiation at a different wavelength E. The radiative structure 240 can include one or more first regions 241 (e.g., absorptive regions) and one or more second regions 242 (e.g., emissive regions). For example, in the embodiment shown in FIG. 2, the radiative structure 240 includes two absorptive regions 241, shown as a first absorptive region 241a and a second absorptive region 241b, positioned on opposite sides of a single emissive region 242. As used herein, the term "absorptive region" refers generally to a region having suitable (e.g., strong) absorptive characteristics at the first wavelength A emitted by the light source 250. The term "emissive region" refers generally to a region having suitable (e.g., strong) emissive characteristics at the second wavelength E. In any of these embodiments, the radiative structure 240 can replace conventional phosphor structures and can accordingly modify the spectrum of light emitted by overall system 200 without the use of phosphors, or with a reduced use of phosphors. Further features and advantages of representative systems are described below with reference to FIGS. 3A-7.

Particular embodiments of the presently disclosed technology are described below in the context of radiative structures having different regions with different material polarizations, resulting, for example, from a difference in material composition or strain of the materials forming the regions and a particular crystal orientation. In other embodiments, the material characteristics of the regions can have other differing characteristics. For example, the regions can have different compositions that produce different bandgap energies. Particular embodiments are disclosed in co-pending U.S. Patent Application Publication No. 2013/0050810, titled "Wavelength Converters for Solid State Lighting Devices, and Associated Systems and Methods", filed Feb. 28, 2013 and incorporated herein by reference.

FIGS. 3A-3F are schematic perspective views of various crystal planes in a portion of a GaN/InGaN material. In FIGS. 3A-3F, Ga (or Ga/In) and N atoms are schematically shown as large and small spheres, respectively. As shown in FIGS. 3A-3F, the GaN/InGaN material has a wurtzite crystal structure with various lattice planes or facets as represented by corresponding Miller indices. A discussion of the Miller index can be found in the *Handbook of Semiconductor Silicon Technology* by William C. O'Mara.

Figure 3A:
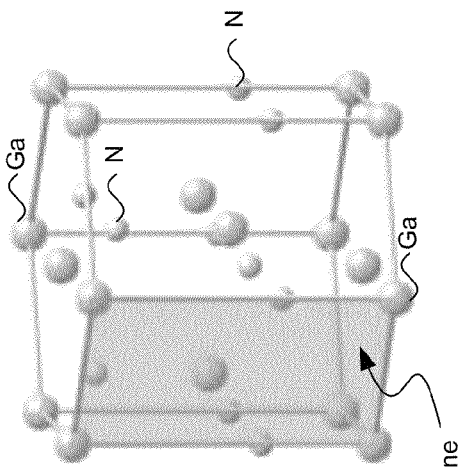
FIGS. 3A-3F are schematic, perspective views of various crystal planes in a GaN/InGaN material in accordance with embodiments of the presently disclosed technology.

As used hereinafter, a "polar plane" generally refers to a crystal plane in a crystal structure that contains only one type of atom. For example, as shown in FIG. 3A, the polar plane denoted as the "c-plane" in the wurtzite crystal structure with a Miller index of (0001) contains only Ga atoms. Similarly, other polar planes in the wurtzite crystal structure may contain only N atoms and/or other suitable type of atoms.

Figure 3B:
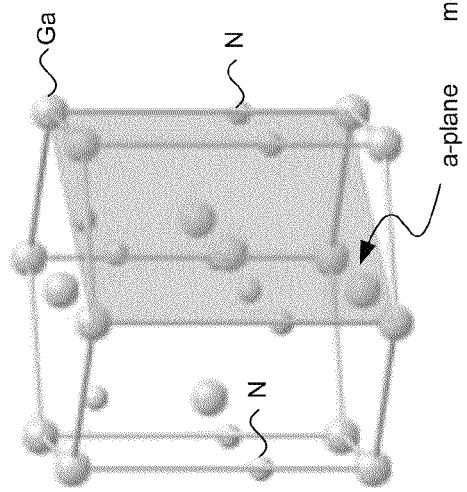
Figure 3C:
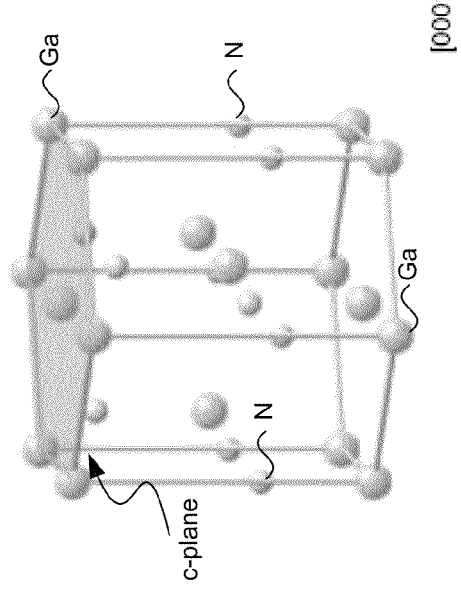

As used hereinafter, a "non-polar plane" generally refers to a crystal plane in a crystal structure that is generally perpendicular to a polar plane (e.g., to the c-plane). For example, FIG. 3B shows a non-polar plane denoted as the "a-plane" in the wurtzite crystal structure with a Miller index of (11$\bar{2}$0). FIG. 3C shows another non-polar plane denoted as the "m-plane" in the wurtzite crystal structure with a Miller index of (10$\bar{1}$0). Both the a-plane and the m-plane are generally perpendicular to the c-plane shown in FIG. 3A.

Figure 3D:
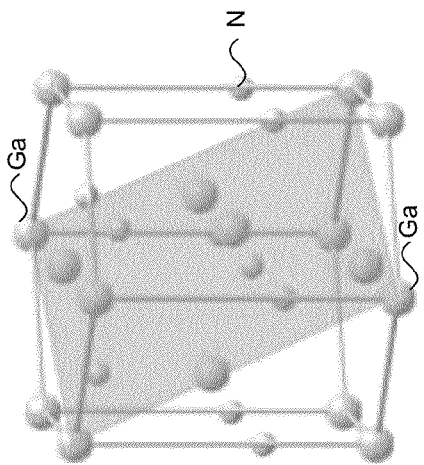
Figure 3E:
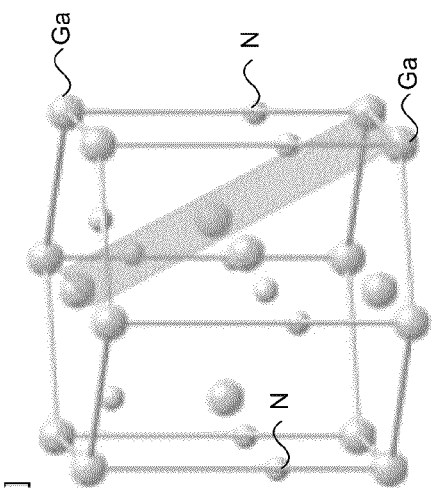
Figure 3F:
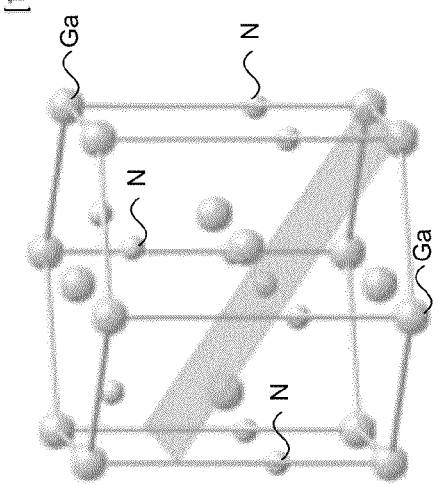

As used hereinafter, a "semi-polar plane" generally refers to a crystal plane in a crystal structure that is canted relative to a polar plane (e.g., to the c-plane) without being perpendicular to the polar plane. For example, as shown in FIGS. 3D-3F, each of the semi-polar planes in the wurtzite crystal structure with Miller indices of (10$\bar{1}$3), (10$\bar{1}$1), and (11$\bar{2}$2) form an angle with the c-plane shown in FIG. 3A. The angle is greater than 0° but less than 90°. Only particular examples of crystal planes are illustrated in FIGS. 3A-3F. Accordingly, the polar, non-polar, and semi-polar planes can also include other crystal planes not specifically illustrated in FIGS. 3A-3F. In general, the designer can select the material polarization of the materials forming wavelength converters in accordance with embodiments of the present disclosure by selecting the angle along which a corresponding epitaxial substrate is cut. This in turn determines the material polarization of the subsequent epitaxially grown layers. In general, different layers will have the same crystal orientation (as individual layers are grown epitaxially on the layer below), but will have different material polarizations, e.g. due to different concentrations of particular constituents, such as indium.

Figure 4:
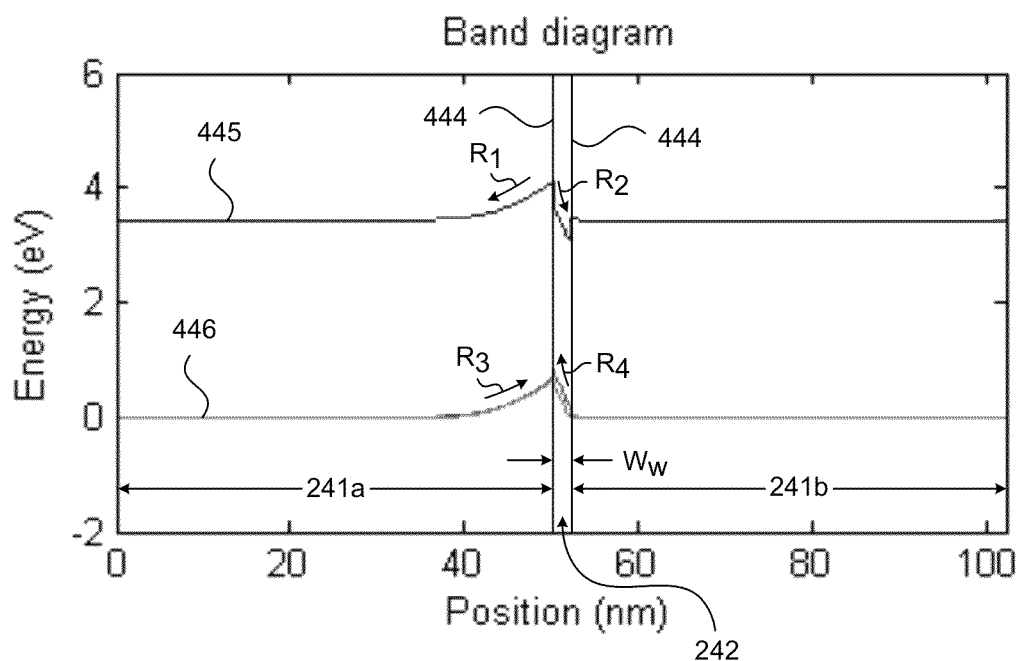
FIG. 4 is a band diagram illustrating interfaces between materials having different material polarizations in accordance with an embodiment of the presently disclosed technology.

As described above with reference to FIG. 2, wavelength converters in accordance with the present technology can include one or more first or absorptive regions, and one or more second or emissive regions. The emissive regions can receive carriers from adjacent absorptive regions and can accordingly form quantum wells. FIG. 4 is a representative band diagram illustrating a conduction band 445 and a valance band 446 for a second region 242 (e.g., a quantum well) surrounded by corresponding first regions 241a, 241b. In a particular aspect of this embodiment, the second region 242 is a single, 2 nm-wide gallium indium nitride structure grown along the c-axis. In still a further particular embodiment, the composition of the second region 242 is $Ga_{0.78}In_{0.22}N$. In other embodiments, the second region 242 can include other gallium indium nitride structures, other III-nitride heterostructures, and/or other non-Group III heterostructures (e.g., Group II or Group VI heterostructures). In any of these embodiments, the second region 242 can form interfaces (e.g., heterointerfaces) 444 at the junctions between the second region 242 and the surrounding first regions 241a, 241b. The heterointerfaces 444 may be graded or abrupt, depending upon the particular embodiment. In general, based on the different material polarizations in the first and second regions, the heterointerfaces create electric fields that assist in the transport of optically generated electron-hole pairs from the first regions 241a, 241b to the second region 242.

In a particular aspect of an embodiment shown in FIG. 4, the discontinuity in the polarization field between the second region 242 and the adjacent first regions 241a, 241b creates a negative sheet charge to the left of the second region 242. This negative sheet charge repels electrons and pushes the edge of the conduction band 445 upwards. To the right of the second region 242 is a positive sheet charge which attracts electrons and pulls the conduction band edge 445 down. The electric field to the left of the second region 242 pushes electrons to the left, as indicated by arrow R1. In the second region 242, an electric field pushes the electrons to the right, as indicated by arrow R2. Holes are pushed in the opposite direction: to the right in the first region 241a (as indicated by arrow R3) and to the left in the second region (as indicated by arrow R4).

As described further below with reference to FIGS. 5-7B, radiative structures can be designed with multiple quantum wells separated by corresponding barriers in such a way that the polarization mismatches at the heterointerfaces between these structures create electric fields that funnel carriers (e.g., holes and/or electrons) into the adjacent layers, so as to produce emitted light at a target wavelength.

Figure 5:
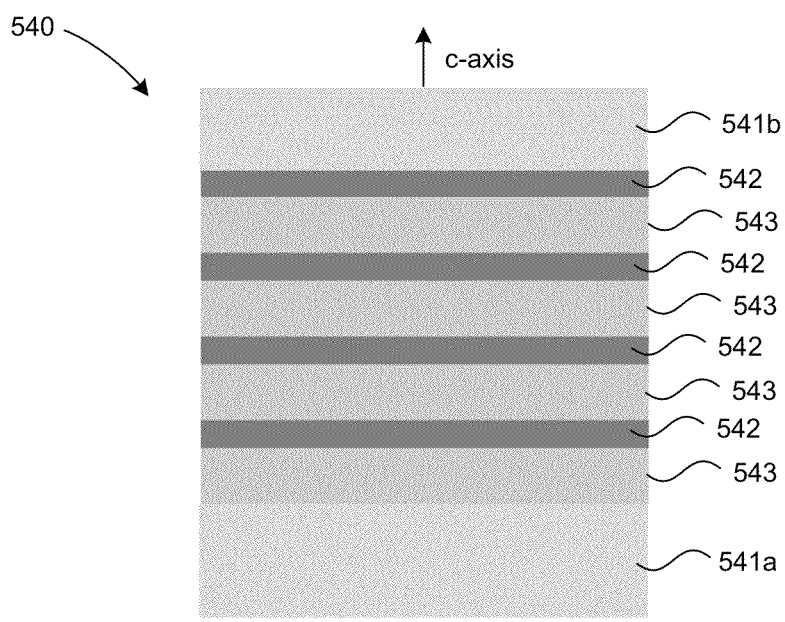
FIG. 5 is a partially schematic illustration of a portion of a radiative structure having quantum wells and barriers alternating in accordance with an embodiment of the presently disclosed technology.

FIG. 5 is a schematic illustration of a representative radiative structure 540 that includes multiple quantum wells 542 (four are shown in FIG. 5), interleaved with multiple barriers 543 (four are shown in FIG. 5), and sandwiched between corresponding first regions 541a, 541b. Embodiments of the present disclosure are not limited to those shown in FIG. 5. For example, other embodiments can include any suitable number of quantum wells and barriers, depending on device characteristics. In particular embodiments, the first regions 541a, 541b can include N—GaN. In the illustrated embodiment, the lower first region 541a can provide a substrate for epitaxial growth of the barriers 543 and the quantum wells 542. The upper first region 541b can be eliminated in some embodiments. However, an advantage of the upper first region 541b is that it can separate the quantum wells 542 from the outermost surface of the structure 540, thus reducing or eliminating surface charges that can adversely affect the performance of the structure 540. The quantum well composition can be $Ga_{0.78}In_{0.22}N$, and the barrier composition can be $Ga_{0.9}In_{0.1}N$, in particular embodiments, and can have other compositions in other embodiments. The doping concentration can be $5 \times 10^{18}$ cm$^{-3}$ in the N—GaN and in the barriers 543, and can have other values in other embodiments. The quantum wells 542 and corresponding barriers 543 are stacked (e.g., grown) generally perpendicular to the c-axis, as shown in FIG. 5. In other embodiments, the barriers 543 can be N—GaN without indium. However, an advantage of including indium (or another suitable element) is that it is expected to increase the absorptivity of the barriers 543, and therefore the wavelength conversion efficiency of the structure 540. In still further embodiments, materials other than GaInN can be used for the quantum wells 542 and the barriers 543. Suitable materials include zinc oxide or other materials having a wurtzite crystal structure.

Figure 6:
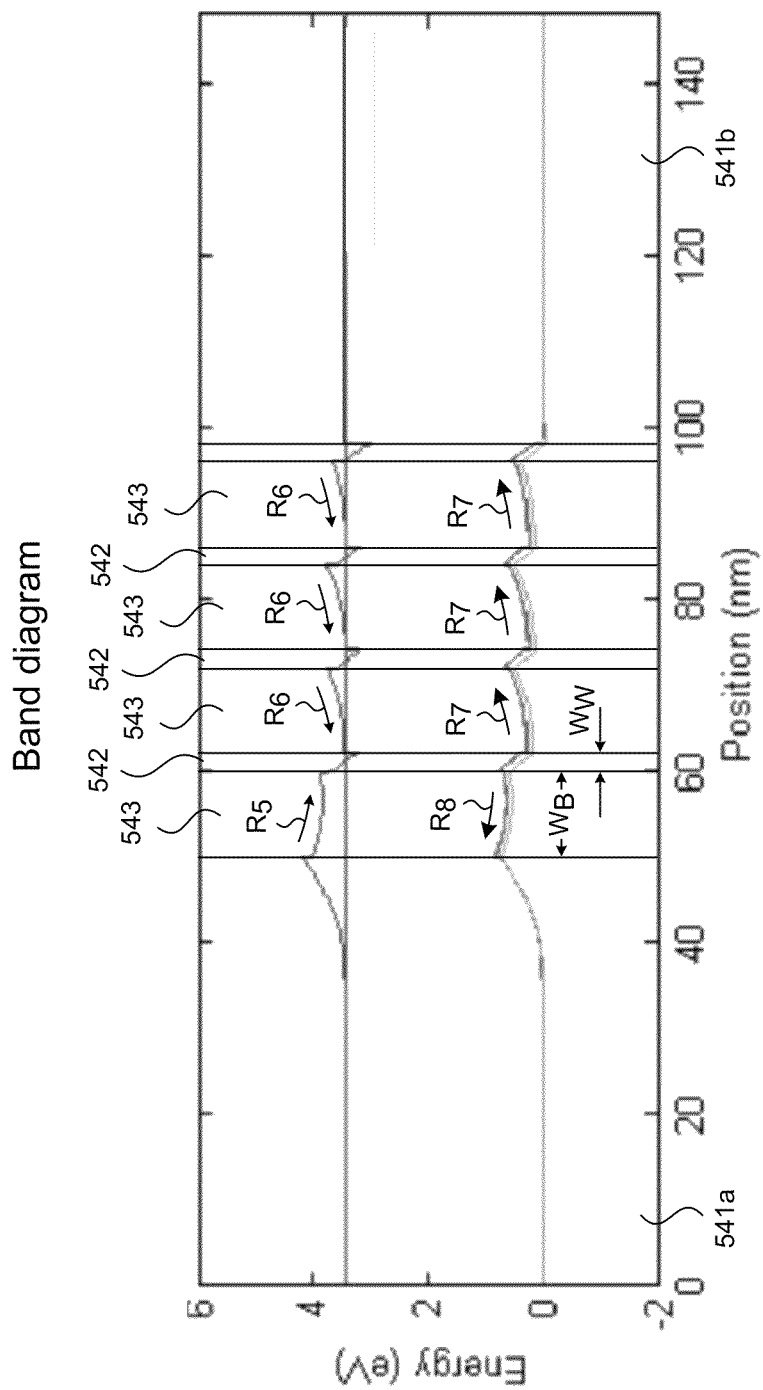
FIG. 6 is a band diagram illustrating the behavior expected of a representative structure shown in FIG. 5, in accordance with an embodiment of the presently disclosed technology.

FIG. 6 illustrates a band diagram corresponding to the structure described above with reference to FIG. 5. Each of the quantum wells 542 has a well width $W_w$ of approximately 2 nanometers, and each barrier 543 has a barrier width $W_B$ of approximately 10 nanometers. Accordingly, the total absorption thickness (e.g., the thickness of material absorbing incident radiation at a first wavelength) is 48 nanometers, while the total quantum well thickness is 8 nanometers. Both the barriers 543 and the quantum wells 542 absorb incident light. As the light is absorbed, it generates electrons and holes (e.g., optically generated carriers). When the electrons and holes are located in the quantum wells 542, they are at an electropotential minimum (or relative minimum) and are accordingly confined. When electrons are located in the barriers 543, they experience an electric field, which pushes the electron toward a nearby quantum well 542. For example, in the leftmost barrier 543 shown in FIG. 6, electrons are pushed to the right, as indicated by arrow R5. In the next three barriers 543, the electrons are pushed to the left, as indicated by arrows R6. In a generally similar manner, holes located in a barrier are pushed toward a corresponding quantum well by the field resulting from the difference in polarization between the barrier 543 and the quantum well 542. For example, holes in the right-most three barriers 543 are forced to the right as indicated by arrows R7 and into the adjacent quantum wells 542. Holes in the leftmost barrier 543 are pushed into the adjacent first region 541a as indicated by arrow R8. In this manner, the polarization-induced fields act to funnel electrons and holes into the adjacent quantum wells 542, where they may combine efficiently and emit light (or other radiation) at the target wavelength.

Figure 7A:
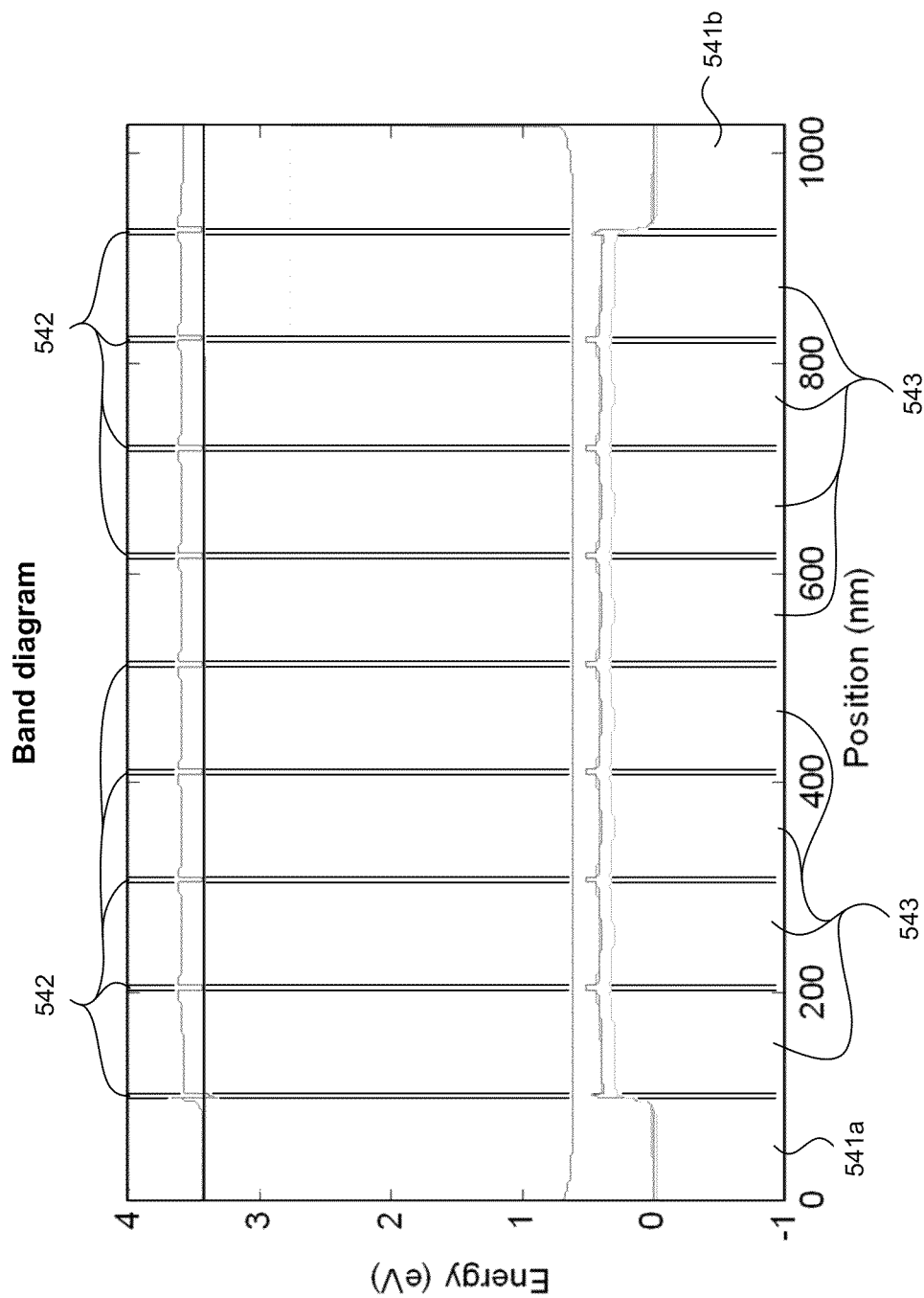
FIGS. 7A and 7B are band diagrams comparing band gap energies for simulated structures having non-polar characteristics (FIG. 7A) and polar characteristics (FIG. 7B) in accordance with embodiments of the presently disclosed technology.
Figure 7B:
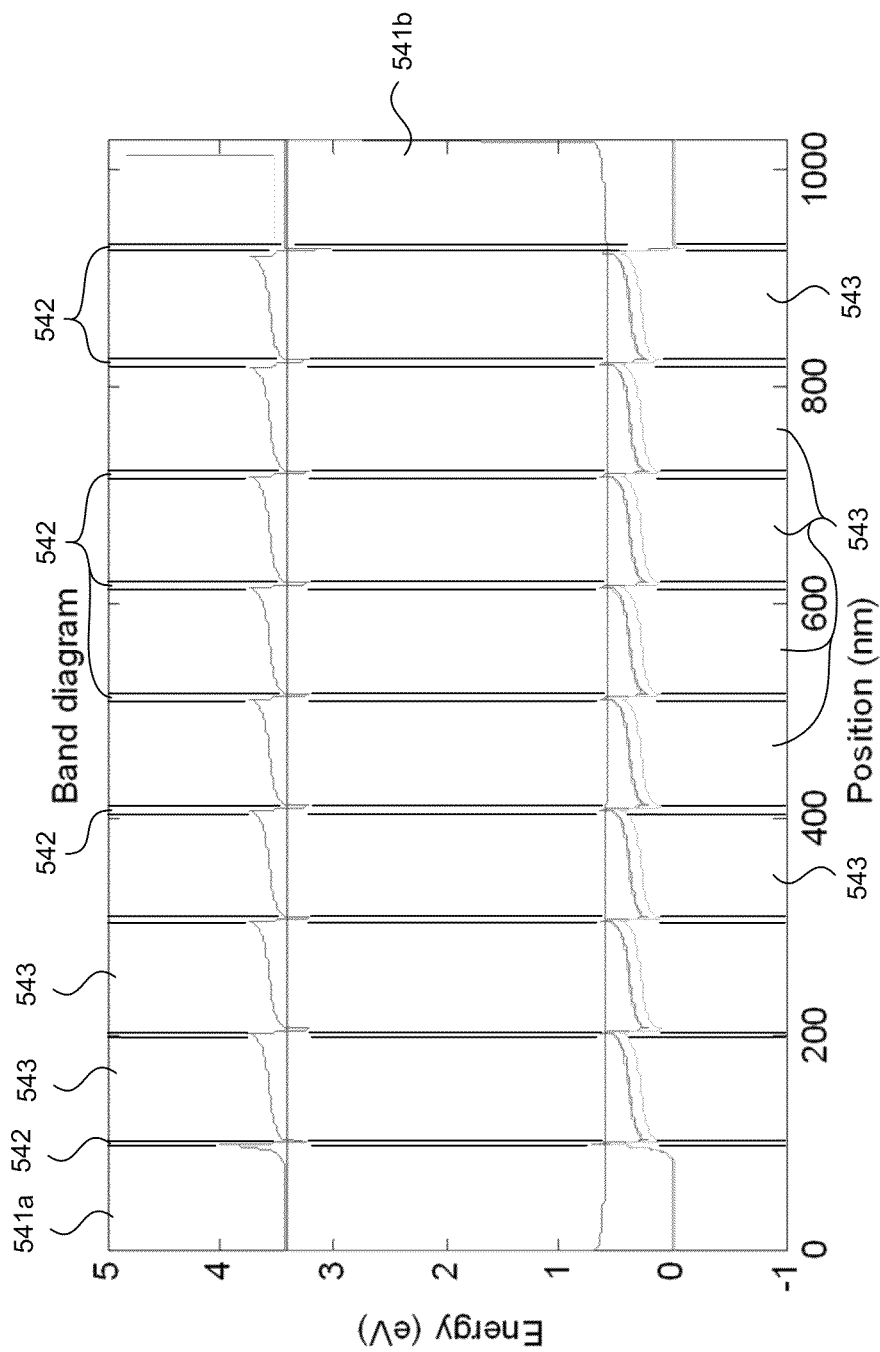

FIGS. 7A and 7B illustrate the results of a numerical simulation conducted to demonstrate the efficacy of structures having characteristics generally similar to those described above with reference to FIGS. 2-6. In this particular simulation, the structures include a stack of nine quantum wells 542, each having a width of approximately 3 nanometers and a composition of $Ga_{0.8}In_{0.2}N$. Neighboring quantum wells 542 are separated by barriers 543 having a width of approximately 100 nanometers and a composition of $Ga_{0.9}In_{0.1}N$. The outermost quantum wells are positioned adjacent to layers of gallium nitride 541a, 541b. The silicon doping concentration is $5 \times 10^{18}$ cm$^{-3}$ in the gallium nitride 541a, 541b and $1 \times 10^{18}$ cm$^{-3}$ in the barriers 543. Non-radiative recombination lifetimes in the barriers are assumed to be 5 nanoseconds for both electrons and holes. FIG. 7A illustrates a simulation for which the polarization within the structure is zero. This case is analogous to potential wavelength conversion structures with non-polar semiconductors, or with polar semiconductors, but along non-polar directions. FIG. 7B illustrates the results when the polarization within the structure is the predicted amount for c-plane gallium indium nitride heterostructures. In both simulations, all layers are assumed to be pseudomorphic (e.g., strained).

The simulation method solves the Poisson equation and continuity equations for electrons and holes self-consistently. The boundary condition for the simulation is that no current flows in or out of the structure, which is the case if the structure is not connected to an electrical circuit. An undepleted optical pump is assumed to generate electron-hole pairs uniformly within both the quantum wells 542 and the barriers 543. This pump corresponds to an LED or other light source that generates the optical energy absorbed by the radiative structure and reemitted at a different wavelength. The total number of generated carriers is assumed to be equal for the results shown in both FIGS. 7A and 7B, and the carriers are permitted to move freely through drift and diffusion processes and recombine either non-radiatively (through Shockley-Reed-Hall recombination or Auger recombination) or radiatively, thereby generating light.

Still referring to FIGS. 7A and 7B, the steady state band diagrams of the two structures in the presence of optical exitation are shown. The electron and hole quasi-Fermi levels are separated, as expected. The differences between the two cases are clearly shown. In FIG. 7B, the polarization produces electric fields that exist in the barriers 543 and that act to direct carriers toward the quantum wells 542 where they accumulate to sufficiently high densities to recombine efficiently. This is not the case for the structure without polarization (shown in FIG. 7A), where the lifetime of the carriers generated in the barriers 543 will be longer.

The ultimate output of the calculation based on the foregoing simulations is the relative rate of radiative and non-radiative recombination. In the structure represented by FIG. 7B, the Shockley-Reed-Hall recombination rate was reduced by 30.9%, while the radiative rate was increased by 17.6%. Accordingly, FIGS. 7A and 7B demonstrate the efficiency enhancement that maybe obtained by taking advantage of polarization-enhanced carrier capture.

One feature of at least some of the foregoing embodiments described above with reference to FIGS. 2-7B is that the disclosed technology can include structures that are selected based on crystal-based material polarization to concentrate carriers in regions selected to emit radiation at particular wavelengths. These structures can more efficiently convert energy received at one wavelength to energy emitted at a second wavelength. An advantage of this arrangement is that it can reduce power consumed by the device, and/or increase the light output by the device, when compared with conventional wavelength converters, for example, phosphor coatings and the like. In particular, the radiative structure can be manufactured and operated with a phosphor.

From the foregoing, it will be appreciated that specific embodiments of the disclosed technology have been described herein for purposes of illustration, but that various modifications may be made without deviating from the disclosed technology. For example, materials having different material polarizations can be combined based on isotropic and/or anisotropic material polarizations. The material polarizations of adjacent elements in a wavelength converter structure can change abruptly at the hetero interfaces, as was generally shown above, or gradually, e.g., by gradually varying the concentration of indium at the hetero interfaces between GaInN barriers and quantum wells. Certain embodiments of the technology were described in the context of particular materials (e.g., gallium nitride and gallium indium nitride), but in other embodiments, other materials can be used to produce similar results. Certain embodiments of the technology were described above in the context of shifting the wavelength of visible light. In other embodiments similar structures and methods can be used to shift energy at other wavelengths.

Certain aspects of the technology described in the context of particular embodiments may be combined or eliminated in other embodiments. For example, particular embodiments can include more or fewer barriers and quantum wells than described above with reference to FIGS. 5-7B. The wavelength conversion structure can include a single first region rather than two, e.g., if the first region is properly doped. The structures described above can be combined with additional structures (e.g., lenses, power sources controllers, and/or other devices) depending upon the functions the structures are intended to perform. Further, while advantages associated with certain embodiments have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly shown or described herein.

We claim:

1. A method for forming a radiative system, comprising:
    selecting a first material to have a first material polarization and to absorb incident light emitted from a light source at a first wavelength, wherein the first material has a stronger absorption than emission at the first wavelength, and wherein the incident light optically generates carriers in the first material;
    selecting a second material to have a second material polarization different than the first material polarization and to emit light at a second wavelength greater than the first wavelength, wherein the second material absorbs the incident light and has a stronger emission than absorption at the second wavelength; and
    disposing the first and second materials adjacent to each other to form an interface,
    wherein at least one of selecting the first material and the second material includes selecting at least one of the first and the second material polarizations to produce an electric field at the interface that drives electrons, holes, or both electrons and holes of the optically generated carriers from the first material to the second material such that they radiatively recombine at the second material to output an emission at the second wavelength.

2. The method of claim 1, further comprising fixing the first and second materials relative to each other.

3. The method of claim 1 wherein the electric field includes a first electric field, and wherein the first material includes a first region of the first material and a second region of the first material, and wherein disposing the first and second materials includes disposing the first and second materials with the second material positioned between the first and second regions of the first material to produce the first electric field at an interface between the second material and the first region, and to produce a second electric field at an interface between the second material and the second region, the first electric field being oriented to drive electrons from the first region to the second material, the second electric field being oriented to drive holes from the second region to the second material.

4. The method of claim 1, further comprising selecting the first and second materials to include a common constituent, with the constituent having a first concentration in the first material that is greater than zero, and a second concentration in the second material that is different than the first concentration and less than 100%.

5. The method of claim 4, further comprising selecting the first and second materials to include alloys of gallium nitride.

6. The method of claim 1 wherein disposing the first and second materials includes forming an alternating stack of barriers and quantum wells.

7. The method of claim 4 wherein the first and second materials include gallium indium nitride, and wherein the constituent includes indium.

8. The method of claim 7 wherein the first concentration is about 10%.

9. The method of claim 7 wherein the second concentration is about 22%.

10. The method of claim 1 wherein the first material is grown from an epitaxial growth substrate, and wherein selecting at least one of the first and the second material polarizations to produce the electric field includes selecting an angle along which the epitaxial substrate is cut.

11. A radiation system, comprising:
 a light source configured to emit radiation at a first wavelength; and
 a solid state radiative semiconductor structure coupled to the light source, the solid state radiative semiconductor structure including
  a first region positioned to absorb radiation at the first wavelength and thereby generate electrons, holes, or both electrons and holes in the first region, the first region having a first value of a material characteristic; and
  a second region positioned adjacent to the first region to absorb radiation at the first wavelength and to emit radiation at a second wavelength greater than the first wavelength, the second region having a second value of the material characteristic that is different than the first value,
 wherein
  the material characteristic includes material polarization,
  the first region has a first material polarization value,
  the second region has a second material polarization value different than the first material polarization value, with the differences between the first and second material polarization values forming a potential gradient at an interface between the first and second regions, and
  the potential gradient has an orientation that drives the generated electrons, holes, or both electrons and holes from the first region to the second region such that they radiatively recombine at the second region to produce an emission at the second wavelength.

12. The system of claim 11 wherein the first material includes gallium nitride and the second material includes gallium indium nitride.

13. The system of claim 11 wherein the first material includes gallium indium nitride with a first concentration of indium that is greater than zero, and the second material includes gallium indium nitride with a second concentration of indium greater than the first concentration.

14. The system of claim 11 wherein both the first and second materials have wurtzite crystal structures.

15. The system of claim 11 wherein both the first and second materials have the same crystal orientation.

16. The system of claim 11 wherein the first region includes a barrier and the second region includes a quantum well, and wherein the system includes a stack of alternating barriers and quantum wells.

17. A radiation system, comprising:
 a light source configured to emit radiation at a first wavelength; and
 a solid state radiative semiconductor structure coupled to the light source, the solid state radiative semiconductor structure including
  a first region positioned to absorb radiation at the first wavelength and thereby generate electrons, holes, or both electrons and holes in the first region, the first region having a first material polarization; and
  a second region positioned adjacent to the first region to emit radiation at a second wavelength different than the first wavelength, the second region having a second material polarization different than the first material polarization, with the first and second material polarizations forming a potential gradient having an orientation at an interface between the first and second regions selected to drive the generated electrons, holes, or both electrons and holes in the radiative structure from the first region to the second region such that they radiatively recombine at the second region to produce an emission at the second wavelength.

18. The system of claim 17 wherein a composition of the semiconductor structure has a step change at an interface between the first and second regions.

19. The system of claim 17, further comprising an energy source positioned to direct radiation at the first wavelength toward the first region of the semiconductor structure.

20. The system of claim 17 wherein the first and second regions are polar regions and wherein an interface between the first and second regions is at a c-plane of at least one of the first and second regions.

21. The system of claim 17 wherein the first and second regions are semi-polar regions.

22. The system of claim 17 wherein the first region includes a barrier and the second region includes a quantum well, and wherein the system includes a stack of alternating barriers and quantum wells, with individual barriers comprising indium gallium nitride with a first concentration of indium that is greater than zero, and with individual quantum well comprising indium gallium nitride with a second concentration of indium greater than the first concentration, and wherein the quantum wells and the barriers have the same wurtzite crystal orientation.

23. A solid state lighting (SSL) system, comprising:
 a solid state radiative semiconductor structure, having:
  an alternating arrangement of first and second regions, with individual first regions positioned between consecutive second regions, and with individual second regions positioned between consecutive first regions,
 where
  individual first regions are positioned to absorb light at a first wavelength and thereby generate electrons and holes, the individual first regions comprising a first material having a first material polarization and a stronger absorptivity than emissivity at the first wavelength, and
  individual second regions comprising a second material different than the first material, the second material having a second material polarization different than the first material polarization and a stronger emissivity than absorptivity at a second wavelength greater than the first wavelength, wherein the second material is configured to produce electrical field gradients having an orientation such that the electrons and holes radiatively recombine in the individual second regions to output an emission at the second wavelength.

24. The system of claim 23 wherein individual first regions comprise indium gallium nitride with a first concentration of indium greater than zero, and individual second regions comprise indium gallium nitride with a second concentration of indium greater than the first concentration, and wherein the individual first regions and the individual second regions have the same wurtzite crystal orientation.

25. The system of claims 23, further comprising an SSL device that includes an active region positioned adjacent to an N-type material and a P-type material, the active region being positioned to emit light at the first wavelength directed to the solid state radiative semiconductor structure.

* * * * *